(12) United States Patent
Da Dalt

(10) Patent No.: US 6,809,601 B2
(45) Date of Patent: Oct. 26, 2004

(54) PHASE DETECTOR FOR A DELAY LOCKED LOOP AND DELAY LOCKED LOOP WITH THE PHASE DETECTOR

(75) Inventor: Nicola Da Dalt, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/444,545

(22) Filed: May 23, 2003

(65) Prior Publication Data

US 2004/0008088 A1 Jan. 15, 2004

(30) Foreign Application Priority Data

May 23, 2002 (DE) .......................................... 102 22 873

(51) Int. Cl.[7] .......................... H03D 13/00; H03L 7/089
(52) U.S. Cl. .......................... 331/25; 331/1 A; 327/12; 327/156; 327/158; 327/159
(58) Field of Search ........................... 331/1 A, 25, 27; 327/12, 156–159

(56) References Cited

U.S. PATENT DOCUMENTS 5,485,125 A     1/1996    Dufour
6,323,692 B1 * 11/2001    Tsinker ........................ 327/12

OTHER PUBLICATIONS

Lee, T. H. et al.: "A 2.5 V CMOS Delay–Locked Loop for an 18 Mbit, 500 Megabyte/s DRAM", IEEE Journal of Solid–State Circuits, vol. 29, No. 12, Dec. 1994, pp. 1491–1496.

Tanoi, S. et al.: "A 250–622 MHz Deskew and Jitter–Suppressed Clock Buffer Using Two Loop Architecture", IEEE Journal of Solid–State Circuits, vol. 31, No. 4, Apr. 1996, pp. 487–493.

Jung, Y.–J. et al.: "A Dual–Loop Delay–Locked Loop Using Multiple Voltage–Controlled Delay Lines", IEEE Journal of Solid–State Circuits, vol. 36, No. 5, May 2001, pp. 784–791.

Moon, Y. et al.: "An All–Analog Multiphase Delay–Locked Loop Using a Replica Delay Line for Wide–Range Operation and Low–Jitter Performance", IEEE Journal of Solid–State Circuits, vol. 35, No. 3, Mar. 2000, pp. 377–384.

Sharpe, A. C.: "A 3–State Phase Detector Can Improve Your Next PLL Design", EDN Magazine, Cahners Publishing Company, Sep. 20, 1976, pp. 224–228.

* cited by examiner

Primary Examiner—David Mis
(74) Attorney, Agent, or Firm—Laurence A. Greenberg; Werner H. Stemer; Ralph E. Locher

(57) ABSTRACT

A phase detector for a delay locked loop with a delay unit that delays a periodic clock signal by a settable delay, has a first input for the periodic clock signal, a second input for the delayed clock signal, an UP output and a DOWN output. The phase detector outputs a first pulse signal at the UP output and a second pulse signal at the DOWN output, which signals can respectively assume a first or a second level, for the setting of the delay unit. The first pulse signal changes to the first level in the event of a positive edge of the clock signal and the second pulse signal changes to the first level in the event of a positive edge of the delayed clock signal. In the event that both pulse signals are at the first level, a reset device resets both pulse signals to the second level. The phase detector has a blocking device which taps off at the delay unit a partly delayed clock signal with a delay that is less than the delayed clock signal, and prevents a resetting of the first pulse signal for at least half a period of the clock signal if a positive edge of the partly delayed clock signal occurs while the first pulse signal is at the first level.

14 Claims, 3 Drawing Sheets

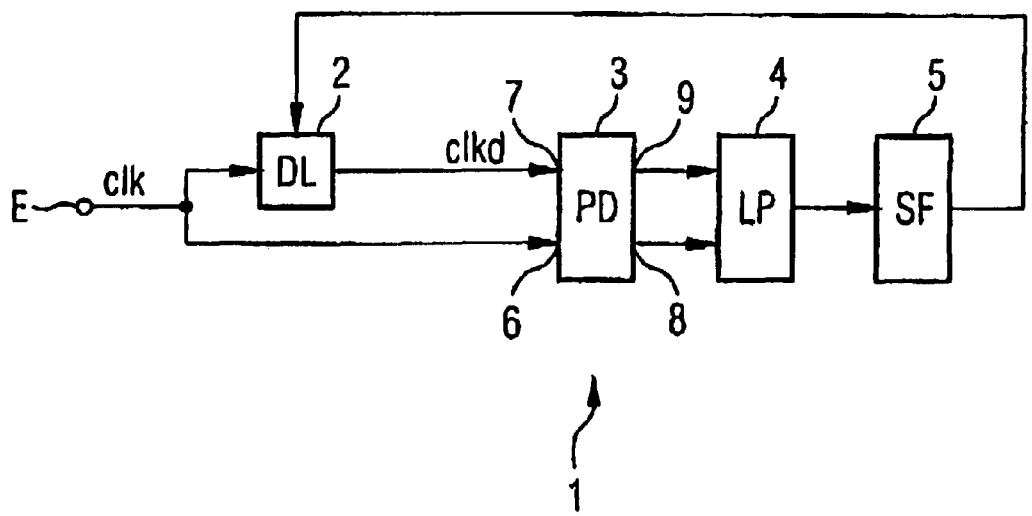
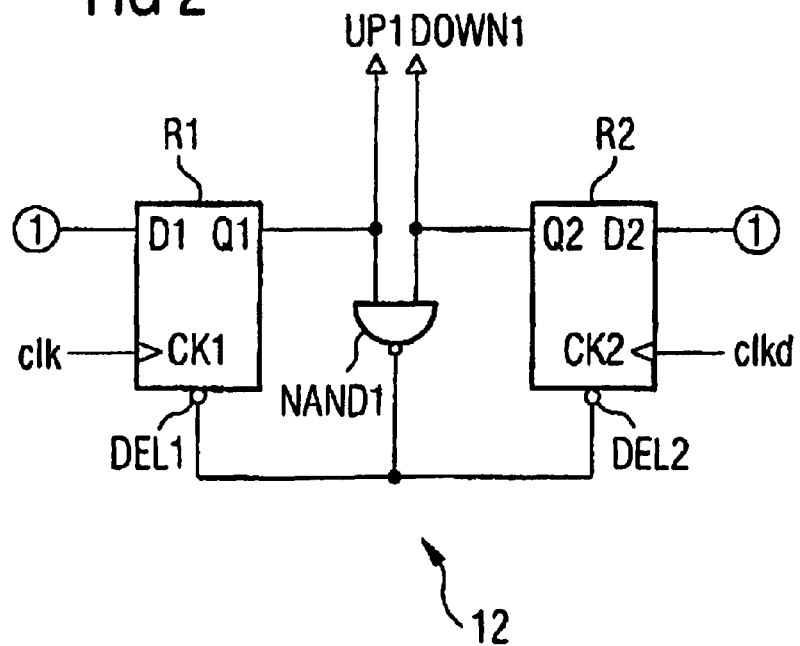

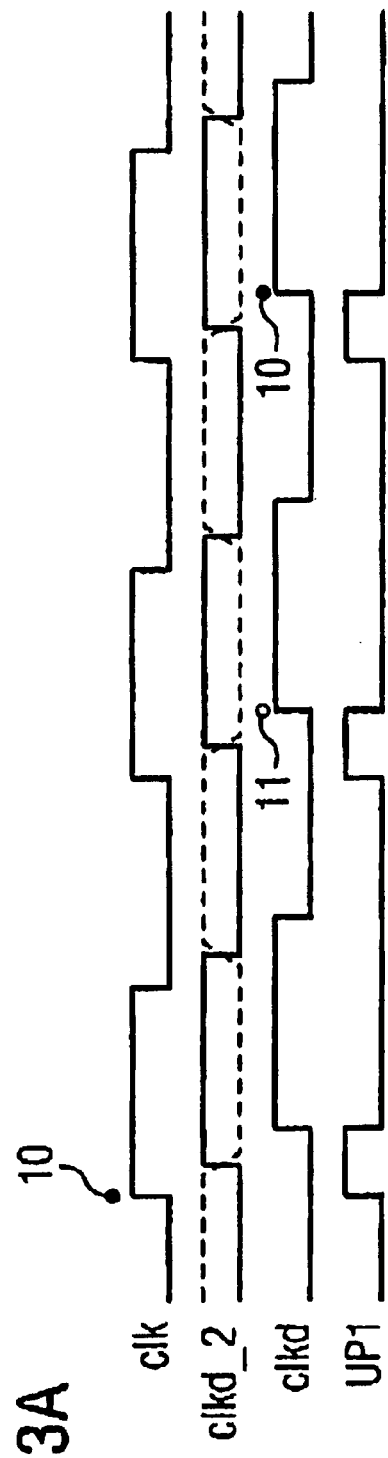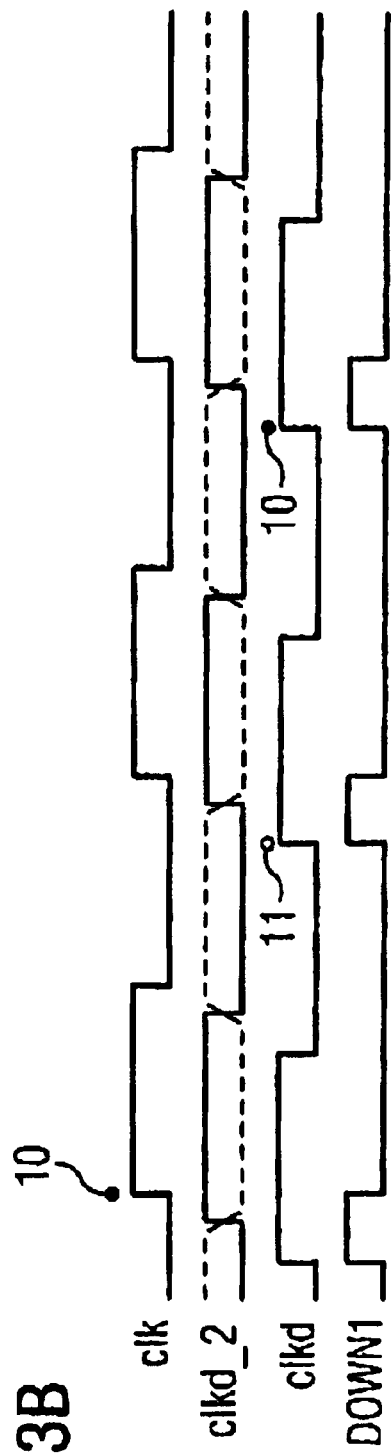

PHASE DETECTOR FOR A DELAY LOCKED LOOP AND DELAY LOCKED LOOP WITH THE PHASE DETECTOR

BACKGROUND OF THE INVENTION

Field of the Invention

The invention relates to a phase detector for a delay locked loop, in which a delay unit delays a periodic clock signal by an adjustable delay. The circuit has a first input for the periodic clock signal, a second input for the delayed clock signal, an UP output and a DOWN output. The phase detector outputs a first pulse signal at the UP output and a second pulse signal at the DOWN output—the signals respectively assuming a first or a second level—for the setting of the delay unit. The first pulse signal changes to the first level in the event of a positive edge of the clock signal and the second pulse signal changes to the first level in the event of a positive edge of the delayed clock signal. When both pulse signals are at the first level, a reset device sets both pulse signals to the second level.

Delay locked loops, also referred to as DLLs, serve to uniformly subdivide a period of a clock signal. This makes it possible to multiply a clock signal with regard to frequency. DLLs constitute an alternative to known phase locked loops (PLLS) for conditioning and frequency synthesis in the case of clock signals.

A DLL usually has a phase detector and a delay chain having, for example, 16 delay stages by way of which the clock signal can be divided into identical time units. In this case, the phase detector determines the phase between the input clock and the delayed clock signal output by the delay chain, determines from this an actuating signal for setting the delay of the delay chain or the delay stages thereof and applies the signal to the delay chain or the delay stages.

One example of such a phase detector is found, for example, in an article by A. Sharpe, "A 3-state phase detector can improve your next PLL design", EDN Magazine, Sep. 20, 1976, pp. 224–28.

In the case of a DLL with a phase detector, a difficulty that may arise is that the delay of the delay chain makes up a multiple of a desired delay which usually amounts to a period of the clock signal. Since the output signal of the delay chain appears the same to the phase detector in this case as in the case of the desired delay, it can happen that the DLL effects regulation to an incorrect delay, namely to a multiple of the desired delay. This should be avoided, however.

This problem area becomes particularly significant against the background of broadband-action DLLs—sought in the meantime—which can process clock signals over a very large frequency range. In order to avoid incorrect locking-on in that context, DLLs with phase mixer circuits have been developed (cf. T. Lee et al., "A 2.5 V CMOS Delay-Locked Loop for an 18 Mbit, 500 Megabyte/s DRAM", IEEE Journal of Solid-State Circuits, Vol. 29, December 1994), but they require very complicated production processes. Moreover, digital approaches have been investigated but overall they exhibit unacceptable phase noise. This has been able to be improved in so-called mixed-mode DLLs (cf. S. Tanoi et al., "A 250–622 MHz Deskew and Jitter-Suppressed Clock Buffer Using Two-Loop Architecture", IEEE Journal of Solid State Circuits, Vol. 31, April 1996), but they are unsatisfactory with regard to complexity and size and also power demand of the circuit.

SUMMARY OF THE INVENTION

It is accordingly an object of the invention to provide a phase detector for a delay locked loop, which overcomes the above-mentioned disadvantages of the heretofore-known devices and methods of this general type and which avoids or reduces erroneous locking-on.

With the foregoing and other objects in view there is provided, in accordance with the invention, a phase detector for a delay locked loop having a delay unit for delaying a periodic clock signal by a settable delay, comprising:
a first input for the periodic clock signal, a second input for a delayed clock signal, an UP output for outputting a first pulse signal, a DOWN output for outputting a second pulse signal, and a reset device, the first and second signals respectively assuming a first level or a second level, for setting the delay unit, the first pulse signal changing to the first level with a positive edge of the clock signal and the second pulse signal changing to the first level with a positive edge of the delayed clock signal and, if the first and second pulse signals are at the first level, said reset device resets the first and second pulse signals to the second level;
a blocking device connected to tap off a partly delayed clock signal at the delay unit, the partly delayed clock signal being delayed relative to the clock signal less than the delayed clock signal, said blocking device being configured to prevent a resetting of the first pulse signal for at least half a period of the clock signal if a positive edge of the partly delayed clock signal occurs while the first pulse signal is at the first level.

In other words, the objects of the invention are achieved by way of a phase detector for a delay locked loop, in which a delay unit delays a periodic clock signal by a settable delay, having a first input for the periodic clock signal, a second input for the delayed clock signal, an UP output and a DOWN output, the phase detector outputting a first pulse signal at the UP output and a second pulse signal at the DOWN output, which signals can respectively assume a first or a second level, for the setting of the delay unit, the first pulse signal changing to the first level in the event of a positive edge of the clock signal and the second pulse signal changing to the first level in the event of a positive edge of the delayed clock signal and, in the event of both pulse signals being at the first level, a reset device setting both pulse signals to the second level, which phase detector has a blocking device, which taps off at the delay unit a partly delayed clock signal, which is delayed less than the delayed clock signal, and prevents a resetting of the first pulse signal for at least half a period of the clock signal if a positive edge of the partly delayed clock signal occurs while the first pulse signal is at the first level.

The invention is based on the insight that, in the event of erroneous locking-on, i.e. if the phase detector does not effect regulation to the desired delay of one period, but rather to a certain multiple thereof, the partly delayed pulse signal exhibits a positive edge during the duration of the first pulse signal, i.e. the UP pulse signal, or the duration of the second pulse signal, i.e. the DOWN pulse signal. Therefore, the phase detector according to the invention suitably evaluates a partly delayed clock signal and then alters the first pulse signal, i.e. the UP pulse signal. In this case, the phase detector outputs a lengthened first pulse signal and thus adjusts the delay locked loop in the direction of a shorter delay. It thus effects regulation to a shorter delay. Erroneous locking-on to a multiple of the desired delay thus becomes less likely or is avoided.

The blocking device of the phase detector prevents the delay locked loop from locking on to a multiple of the desired delay, i.e. to a multiple of the period of the clock signal, in that a positive edge of the partly delayed clock signal is detected and used for a suitable action. In this case, a positive edge is to be understood as a level change of the clock signal which corresponds to the level change at which the first or the second pulse signal is set to the first level. The positive edge will usually be a rising edge of a binary clock signal; of course, a falling edge is also possible.

In customary digital logic, a high or low level will be used respectively as the first or second level. The two levels thus correspond to the logic levels of digital technology. The lengthening of the first pulse signal results in the desired shifting of the delayed clock signal in the direction of a shorter delay. This effect may also be reinforced if the blocking device sets the second pulse signal to the second level as soon as a positive edge of the partly delayed clock signal occurs while the second pulse signal is at the first level. This accelerates the locking-on to the desired delay of one period since a second pulse signal (DOWN pulse signal) that possibly occurs in the event of incorrect locking-on is suppressed, the shifting due to the first pulse signal thereby developing a greater effect.

The blocking device may be designed in diverse ways. Suitable digital logic is expediently used. It is particularly advantageous here that the blocking device acts on the reset device, so that the latter cannot perform resetting of the first pulse signal in the event of a positive edge of the partly delayed clock signal.

The same mechanism may advantageously also be used to effect premature setting of the second pulse signal to the second level. To that end, an advantageous development provides for the blocking device to enable the reset device in order to set the second pulse signal to the second level. Thus, in this development of the phase detector, the blocking device acts in such a way that it then explicitly enables the reset device in such a way that the latter brings about a shortening of the second pulse signal.

Overall, in an advantageous combination of the developments outlined, the blocking device can thus act on the reset device in such a way that the activity of the reset device is blocked with regard to the first pulse signal, but is explicitly enabled with regard to the second pulse signal, if a positive edge of the partly delayed clock signal is detected while the first or the second pulse signal is at the first level.

The tapping-off of the partly delayed clock signal makes erroneous locking-on to a multiple of the desired delay impossible in the phase detector according to the invention. The multiple thereof which is affected depends on what partly delayed clock signal is tapped off, i.e. how large the partial delay is relative to the total delay. Erroneous locking-on is prevented particularly extensively when the blocking device taps off a partly delayed clock signal which is delayed by 1/n of the delay of the delayed clock signal, where n is a prime number.

For many applications, however, it may perfectly well suffice to prevent the likelihood of erroneous locking-on to a specific multiple desired delay. For such cases, it suffices to tap off only a partly delayed clock signal. Depending on the broadband nature of the delay locked loop, it may be expedient, for complete prevention of erroneous locking-on, for the blocking device to tap off a plurality of partly delayed clock signals.

In the case of a phase detector in digital technology, it is expedient to construct the blocking device as a logic circuit with corresponding gates. In this case, a particularly simple construction is achieved by virtue of the fact that the blocking device has a logic element, which, on the input side, on the one hand senses the first pulse signal and on the other hand is fed by an output of a comparison circuit and, on the output side, feeds the UP output and outputs a signal with the first level if the first pulse signal or a signal at the output of the comparison circuit has the first level, the comparison circuit sensing the partly delayed clock signal and the first pulse signal and, in the event of a first pulse signal with the first level and detection of a positive edge of the partly delayed clock signal, applying a signal with the first level to the logic element to the UP output. Additional external circuitry of the phase detector is thus unnecessary and it is possible to work with inexpensive components.

In this case, the comparison circuit can be realized in a wide variety of ways. It is particularly expedient for the blocking device to have an edge-triggered D-type flip-flop element, to whose clock input the partly delayed clock signal is fed, since the required evaluation of the partly delayed clock signal is then effected using simple standard components. If a plurality of partly delayed clock signals are tapped off in this case, it is advantageous to use an edge-triggered D-type flip-flop element for each partly delayed clock signal.

Such D-type flip-flop elements are also appropriate, moreover, for the generation of the first and second pulse signals, since a simple construction is thus achieved overall. Therefore, a development of the invention is provided, comprising a first and a second edge-triggered D-type flip-flop element each having a data input, a clock input, an output and a reset input, the data inputs of the two elements being fixed at the first level, the clock signal being applied to the data input of the first element and the delayed clock signal being applied to the data input of the second element, and the output of the first element being connected to the UP output and the output of the second element being connected to the DOWN output and the outputs of the elements further being connected to the reset inputs of the two elements via a logic AND combination unit.

Other features which are considered as characteristic for the invention are set forth in the appended claims.

Although the invention is illustrated and described herein as embodied in a phase detector for a delay locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a delay locked loop with a phase detector;

FIG. 2 is a circuit diagram of a phase detector;

FIGS. 3A and 3B are timing diagrams illustrating various signals in the delay locked loop of FIG. 1.

DESCRIPTION OF THE PREFERRED EMBODIMENTS

Figure 4:
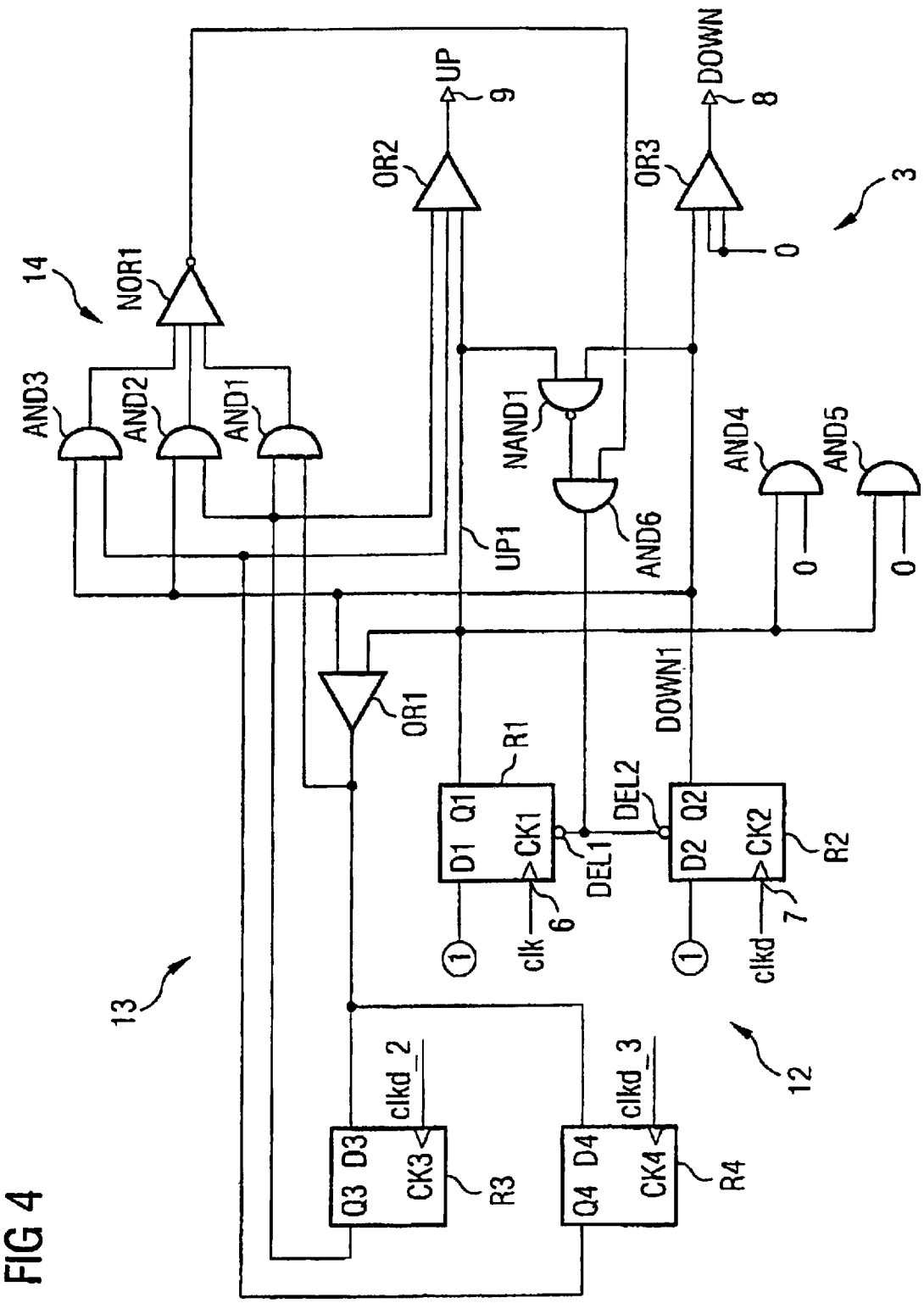
FIG. 4 is a circuit diagram of a phase detector.

Referring now to the figures of the drawing in detail and first, particularly, to FIG. 1 thereof, there is shown a control loop configured as a delay locked loop DLL 1. The DLL 1 has a delay chain 2, to which a clock signal clk is fed from an input E. The delay chain 2 comprises a plurality of cascaded delay stages having an adjustable or settable delay.

The delay stages may be realized for example by current-controlled inverters, the driver capability and thus the delay being set by way of the current feed. The delay chain 2 furthermore has a control input, via which a signal is fed for the setting of the delay in feedback from the output of the DLL 1, which will be explained in more detail later.

A delayed clock signal clkd is output by the delay chain 2 and it is fed, in the same way as the original clock signal clk, to a phase detector 3. The phase detector 3 is designed such that it supplies signals which depend on the phase shift between the delayed clock signal clkd and the original clock signal clk. The phase detector controls a charge pump circuit 7 via two lines. The charge pump circuit 7 generates a feeding current which sets the delay chain 2 at the control input after having been filtered by a loop filter 5.

The DLL 1 causes the delay of the delay chain 2 to be regulated in such a way that the delayed clock signal clkd, which is fed to the phase detector 3 at an input 7, lags behind the original clock signal clk, taken up by the phase detector at an input 6, by precisely one period. Therefore, the circuit of FIG. 1 is also referred to as a follow-up synchronization circuit.

In the steady-state condition, there is a phase difference of precisely one period between the clock signal clk at the input 6 of the phase detector and the delayed clock signal clkd at the input 7 of the phase detector 3. If a deviation from this desired delay occurs, the phase detector 3 detects this and outputs corresponding pulse signals at its outputs 8 and 9 to the charge pump circuit 4, so that the output thereof effects a corresponding adjustment of the delay chain 2.

Referring now to FIG. 2, the phase detector 3 has a phase detector core 12. The phase detector core 12 has two edge-triggered D-type flip-flops R1 and R2, whose data inputs D1 and D2 are respectively connected to a logic high level. The flip-flop R1 receives the clock signal clk at its clock input CK1 while the flip-flop R2 taps off the delayed clock signal clkd at its clock input CK2. A raw pulse signal UP1 is then present at the output Q1 of the flip-flop R1, whereas a raw pulse signal DOWN1 is output at the output Q2 of the flip-flop R2. These two raw pulse signals UP1, DOWN1 furthermore act on a NAND gate NAND1 whose output is connected to two reset inputs DEL1 and DEL2 of the flip-flops R1 and R2.

The phase detector core 12 of FIG. 2 has the effect that a rising edge at the clock input CK1 of the flip-flop R1 brings the raw pulse signal UP1 to the logic high level. An analogous situation holds true in the event of a rising edge of the delayed clock signal clkd at the input CK2 of the flip-flop R2 with the raw pulse signal DOWN1. However, if both raw pulse signals UP1 and DOWN1 are at a high level, the reset inputs DEL1 and DEL2 are activated immediately and the flip-flops R1 and R2 are thus reset, as a result of which the raw pulse signals UP1 and DOWN1 once more attain a logic low level.

Consequently, for the time duration between a rising edge of the signal clk and a rising edge of the clock signal clkd, the phase detector core 12 outputs a raw pulse signal UP1 with a high level if the phase shift between clk and clkd is less than half a period. If the phase shift is more than half a period, the raw pulse signal DOWN1 is at a high level for the time duration between a rising edge of the delayed clock signal clkd and a rising edge of the clock signal clk.

This behavior of the phase detector core 12 is readily discernible in the signal profiles of FIGS. 3A and 3B. FIG. 3A illustrates the case where the delayed clock signal clkd is phase shifted relative to the clock signal clk by a multiple of the period of the clock signal clkd plus somewhat less than half a period. Reference points 10 which are symbolized by filled circles and designate assigned rising edges of the clock signal clk and of the delayed clock signal clkd are depicted here in order to improve the illustration.

FIG. 3A reveals that the raw pulse signal UP1 changes to a high level with a rising edge of the clock signal clk. With the next rising edge of the delayed clock signal clkd, the flip-flops R1 and R2 are reset, as a result of which the pulse signal UP1 falls back to the logic low level. In this case, the pulse thus caused in the raw pulse signal UP1 has the effect that the charge pump circuit 4 drives the delay chain 2 in such a way that the delay is shortened. The rising edge of the delayed clock signal clkd at the reference point 10 is thus shifted forward.

FIG. 3B reveals a case in which the delay is somewhat less than a multiple of the period of the clock signal clk. Here, a rising edge of the delayed clock signal clkd leads a rising edge of the clock signal clk somewhat. In this case, the delay is somewhat shorter than two periods of the clock signal clk, as shown by the reference points 10.

A rising edge of the delayed clock signal clkd thus raises the raw pulse signal DOWN1 to a high level, which is left only when the clock signal clk also exhibits a rising edge. With this rising edge of the clock signal clk, the flip-flops R1 and R2 are reset by way of a corresponding activity of the NAND gate NAND1.

It is clearly discernible in FIGS. 3A and 3B that the raw pulse signals UP1 and DOWN1 are not directly suitable for the driving of the charge pump circuit 4, since locking-on to a delay for which the reference points 10 would be spaced apart from one another by two periods was effected in each of the examples of FIGS. 3A and 3B. A delay by only one period of the clock signal clk is desired, however. The phase detector core 12 is therefore connected up in the manner shown in FIG. 4.

The outputs Q1 and Q2 of the flip-flops R1 and R2 are connected to the inputs of an OR gate OR1, whose output feeds data inputs D3 and D4 of two further flip-flops R3 and R4. At its clock input CK3, the flip-flop R3 receives a partly delayed clock signal clkd2, which has precisely half the delay with respect to the clock signal clkd. It was routed out at the center of the delay chain 2. By contrast, at the clock input CK4, the flip-flop R4 receives a partly delayed clock signal clkd 3, which is delayed by only one third of the whole delay.

The output Q3 of the flip-flop R3 is connected to the input of an AND gate AND1, to whose second input is applied a signal tapped off from the output of the OR element OR1. The output of the AND gate AND1 feeds a NOR gate NOR1.

The output Q4 of the flip-flop R4 is connected to an input of an AND gate AND3, whose further input is fed by the output Q2 of the flip-flop R2, which generates the raw pulse signal DOWN1. The output of the AND gate AND3 is likewise connected to an input of the NOR gate NOR1. A third input of said NOR gate NOR1 is fed by an AND gate AND2, one input of which is connected to the output Q2 of the flip-flop R2 and the other input of which is connected to the output Q4 of the flip-flop R4. The output of the NOR gate NOR1 is connected to an AND gate AND6, which is connected by its other input into the connecting line between the NOR gate NAND3 and the reset inputs DEL1 and DEL2 of the flip-flops R1 and R2. In a departure from the circuit of FIG. 2, these reset inputs DEL1 and DEL2 are now fed by the output of the AND gate AND6.

The pulse signal UP is output by an OR gate OR2, to whose inputs are fed the raw pulse signal UP1 from the output Q1 of the flip-flop R1, the signal from the output Q3 of the flip-flop R3 and the signal from the output Q4 of the flip-flop R4. The pulse signal DOWN at the output 8 is obtained directly from the raw pulse signal DOWN1 from the output Q2 of the flip-flop R2, an OR gate OR3 additionally being interposed for load matching reasons, said OR gate being symmetrical with respect to the OR gate OR2 and its further inputs being connected to the low level. Since an input of the OR gate OR1 is connected not only to the output Q2 of the flip-flop R2 but also to the inputs of the two AND gates AND2 and AND3, the other input of the OR gate OR2 is connected, for reasons of symmetry, not only to the output Q1 of the flip-flop R1 but also additionally to a respective input of two otherwise functionless AND gates AND4 and AND5, whose further input is in each case connected to a low level.

The logic circuit with the AND gates AND1 to AND3 and the NOR gate NOR1 is part of a comparison circuit 14, which is in turn part of a blocking device 13, which furthermore additionally has the OR gate OR1 and the flip-flops R3 and R4.

The function of this blocking circuit 13 and of the comparison circuit 14 is to lengthen the raw pulse signal UP1 in the event of a rising edge of the partly delayed clock signal clkd2 or clkd3, so that a lengthened pulse signal UP is output if such a rising edge occurs during a raw pulse signal UP1 at high level.

The blocking device 13 analogously effects immediate resetting of the raw pulse signal DOWN1 if it is at a high level and a rising edge of a partly delayed clock signal is detected at the same time.

This function of the circuit shown in FIG. 4 has the effect of preventing the phase detector 3 from locking on to a multiple of the desired delay, for example to a delay by two periods.

This is clearly discernible in FIGS. 3A and 3B. By contrast, if the correct delay is set, which is depicted by an open circle as reference point 11 in FIGS. 3A and 3B, then the partly delayed signals, e.g. the partly delayed signal clkd2 of FIGS. 3A and 3B, do not have a rising edge if the raw pulse signals UP1 and DOWN1 are at a high level. The blocking device 13 then becomes inactive, which is also correct on account of the correct locking-on.

I claim:

1. A phase detector for a delay locked loop having a delay unit for delaying a periodic clock signal by a settable delay, comprising:

a first input for the periodic clock signal, a second input for a delayed clock signal, an UP output for outputting a first pulse signal, a DOWN output for outputting a second pulse signal, and a reset device, the first and second signals respectively assuming a first level or a second level, for setting the delay unit, the first pulse signal changing to the first level with a positive edge of the clock signal and the second pulse signal changing to the first level with a positive edge of the delayed clock signal and, if the first and second pulse signals are at the first level, said reset device resets the first and second pulse signals to the second level;

a blocking device connected to tap off a partly delayed clock signal at the delay unit, the partly delayed clock signal being delayed relative to the clock signal less than the delayed clock signal, said blocking device being configured to prevent a resetting of the first pulse signal for at least half a period of the clock signal if a positive edge of the partly delayed clock signal occurs while the first pulse signal is at the first level.

2. The phase detector according to claim 1, wherein said blocking device sets the second pulse signal to the second level if a positive edge of the partly delayed clock signal occurs while the second pulse signal is at the first level.

3. The phase detector according to claim 2, wherein said blocking device enables said reset device to set the second pulse signal to the second level.

4. The phase detector according to claim 1, wherein said blocking device taps off a partly delayed clock signal delayed by 1/n of a delay of the delayed clock signal, where n is a prime number.

5. The phase detector according to claim 4, wherein said blocking device taps off a plurality of partly delayed clock signals.

6. The phase detector according to claim 1, wherein said blocking device comprises:

a logic element having a first input receiving the first pulse signal, a second input, and an output feeding the UP output; and a circuit for sensing the partly delayed clock signal and the first pulse signal and, if the first pulse signal has the first level and a positive edge of the partly delayed clock signal is detected, applying a signal with the first level to said second input of said logic element;

said logic element outputting a signal with the first level if the first pulse signal or the signal received from said circuit at said second input has the first level.

7. The phase detector according to claim 6, wherein said circuit of said blocking device has an edge-triggered D-type flip-flop element with a clock input connected to receive the partly delayed clock signal.

8. The phase detector according to claims 6, wherein said blocking device has an edge-triggered D-type flip-flop element for each partly delayed clock signal.

9. The phase detector according to claim 1, which comprises first and second edge-triggered D-type flip-flop elements each having a data input, a clock input, an output, and a reset input, said data inputs of said first and second elements being fixed at the first level, the clock signal being applied to said data input of said first element and the delayed clock signal being applied to said data input of said second element, and said output of said first element being connected to the UP output and the output of said second element being connected to the DOWN output and said outputs of said first and second elements being further connected to said reset inputs of said first and second elements via a logic AND combination unit.

10. A delay locked loop, comprising:

a delay unit for receiving a periodic clock signal with a given period and delaying the clock signal by an adjustable delay, said delay unit generating a delayed clock signal and a partly delayed clock signal delayed relative to the clock signal by a smaller amount than the delayed clock signal;

a phase detector having a first input for the periodic clock signal, a second input for the delayed clock signal, a third input for the partly delayed clock signal, an UP output for outputting a first pulse signal, a DOWN output for outputting a second pulse signal, the first and second pulse signals respectively assuming a first level or a second level, for setting said delay unit, and a reset device for resetting the first and second pulse signals to the second level;

wherein the first pulse signal changes to the first level with a positive edge of the clock signal and the second pulse signal changes to the first level with a positive edge of the delayed clock signal, and said reset device resets the first and second pulse signals to the second level immediately upon both the first and second pulse signals attaining the first level;

a blocking device connected to receive the partly delayed clock signal and to prevent a resetting of the first pulse signal for at least half a period of the clock signal if a positive edge of the partly delayed clock signal occurs while the first pulse signal is at the first level.

11. The delay locked loop according to claim 10, wherein said blocking device sets the second pulse signal to the second level if a positive edge of the partly delayed clock signal occurs while the second pulse signal is at the first level.

12. The phase detector according to claim 11, wherein said blocking device enables said reset device to set the second pulse signal to the second level.

13. The phase detector according to claim 10, wherein the partly delayed clock signal is delayed relative to the clock signal by 1/n of a delay of the delayed clock signal, where n is a prime number.

14. The phase detector according to claim 13, wherein said blocking device is connected to receive a plurality of partly delayed clock signals.

* * * * *